US012655274B2

(12) United States Patent
Aita et al.

(10) Patent No.: US 12,655,274 B2
(45) Date of Patent: Jun. 16, 2026

(54) COMPOSITE MATERIAL, APPLICATIONS THEREOF, AND METHOD FOR PRODUCING COMPOSITE MATERIAL

(71) Applicant: Panasonic Intellectual Property Management Co., Ltd., Osaka (JP)

(72) Inventors: Kazuki Aita, Osaka (JP); Teruhiko Saito, Osaka (JP); Teppei Hosokawa, Hyogo (JP); Honami Inobe, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 18/976,423

(22) Filed: Dec. 11, 2024

(65) Prior Publication Data

US 2025/0109279 A1 Apr. 3, 2025

Related U.S. Application Data

(63) Continuation of application No. PCT/JP2023/020741, filed on Jun. 5, 2023.

(30) Foreign Application Priority Data

Jun. 30, 2022 (JP) ................................ 2022-106355

(51) Int. Cl.

| | |
|---|---|
| ***C08K 9/08*** | (2006.01) |
| ***C08J 5/18*** | (2006.01) |
| ***C08J 5/24*** | (2006.01) |
| ***C09C 3/10*** | (2006.01) |
| ***H05K 1/03*** | (2006.01) |

(52) U.S. Cl.

CPC .................. *C08K 9/08* (2013.01); *C08J 5/18* (2013.01); *C08J 5/249* (2021.05); *C09C 3/10* (2013.01); *H05K 1/0373* (2013.01)

(58) Field of Classification Search

None

See application file for complete search history.

(56) References Cited

U.S. PATENT DOCUMENTS

| | | | |
|---|---|---|---|
| 2021/0115238 A1 | 4/2021 | Williams et al. | |
| 2022/0396490 A1 | 12/2022 | Kamo et al. | |

FOREIGN PATENT DOCUMENTS

| | | | |
|---|---|---|---|
| CN | 111921502 A * | 11/2020 | ........... B01J 20/265 |
| CN | 113980429 | 1/2022 | |
| CN | 114025472 | 2/2022 | |
| JP | 2012-153552 | 8/2012 | |
| JP | 2018-043899 | 3/2018 | |
| WO | 2021/172294 | 9/2021 | |

OTHER PUBLICATIONS

Wang, Y., et al. (Functional nanomaterials through esterification of cellulose: a review of chemistry and application Cellulose (2018) 25:3703â3731). (Year: 2018).*

Effects of Polydopamine Functionalization on Boron Nitride Nanotube Dispersion and Cytocompatibility (Year: 2015).*

International Search Report of PCT application No. PCT/JP2023/020741 dated Aug. 15, 2023.

Haeshin Lee et al., "Mussel-Inspired Surface Chemistry for Multifunctional Coatings", Science, 2007, vol. 318, Oct. 19, 2007, pp. 426-430.

Heng Shen et al., "Bioinspired Modification of h-BN for High Thermal Conductive Composite Films with Aligned Structure", ACS Applied Materials & Interfaces, 2015, vol. 7, Feb. 24, 2015, pp. 5701-5708.

Yuekun Liu et al., "Well-defined functional mesoporous silica/polymer hybrids prepared by an ICAR ATRP technique integrated with bio-inspired polydopamine chemistry for lithium isotope separation", Dalton Transactions, 2017, vol. 46, Apr. 11, 2017, pp. 6117-6127.

Jiacai Li et al., "Thermal and dielectric properties of epoxy resin filled with double-layer surface-modified boron nitride nanosheets", Materials Chemistry and Physics, 2021, vol. 274, Aug. 19, 2021, 125151.

* cited by examiner

*Primary Examiner* — Robert S Jones, Jr.
*Assistant Examiner* — Lily K Sloan
(74) *Attorney, Agent, or Firm* — Rimon P.C.

(57) ABSTRACT

A composite material includes a base material and polydopamine adhered to the base material, the polydopamine containing hydroxy groups. At least one hydrogen atom of the hydroxy groups is substituted with an acyl group.

19 Claims, 4 Drawing Sheets

COMPOSITE MATERIAL, APPLICATIONS THEREOF, AND METHOD FOR PRODUCING COMPOSITE MATERIAL

BACKGROUND

1. Technical Field

The present disclosure relates to a composite material, applications thereof, and a method for producing a composite material.

2. Description of the Related Art

In the field of electronics, the level of performance required in electronic devices has been increasing in recent years as the utilization of 5th generation wireless systems (5G) is expanding. For example, a higher frequency band is used in 5G technology to achieve a higher communication speed than those of past generations. Accordingly, electronic devices need to include a high-frequency-compatible wiring board.

In the transmission line of wiring boards, transmission loss depends on the frequency, that is, the higher the frequency of the signal, the greater the transmission loss. The transmission loss depends on a relative dielectric constant and a dielectric loss tangent. Accordingly, the substrate material that forms the insulating layer of a wiring board needs to have a low relative dielectric constant and a low dielectric loss tangent so that the transmission loss of high-frequency signals can be reduced. In particular, when the frequency is in a high-frequency band, the dielectric loss tangent greatly depends on the orientation polarization of organic molecules present in the substrate material. Accordingly, a reduction in the amount of polar groups present in the substrate material, such as hydroxy groups and amino groups, is needed.

Furthermore, in the case of high-capacity communications, such as those realized by the 5G technology, the radio wave transmission distance is short because of the use of a high-frequency band. Accordingly, the power of electronic devices needs to be increased. In addition, achieving a high degree of integration and miniaturization requires increasing the packaging density of the circuit. Satisfying these needs results in an increase in the amount of heat generated per unit area of the wiring board. Accordingly, wiring boards need to have enhanced heat dissipation properties. An approach commonly used to enhance the heat dissipation properties of a wiring board is to include a filler (filling material) having excellent thermal conductivity, in the substrate material that constitutes the insulating layer of the wiring board, thereby increasing the thermal conductivity of the wiring board.

SUMMARY

In one general aspect, the techniques disclosed here feature a composite material including a base material and polydopamine adhered to the base material, the polydopamine containing hydroxy groups. At least one hydrogen atom of the hydroxy groups is substituted with an acyl group.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
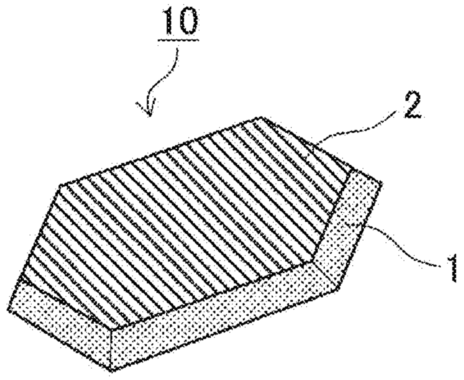
FIG. 1 is a diagram illustrating a schematic configuration of a composite material according to a first embodiment.

Underlying Knowledge Forming Basis of the Present Disclosure

If the heat dissipation properties of a wiring board are enhanced by increasing a content of a filler in a resin composition, mechanical properties such as flexibility are impaired, which is likely to result in embrittlement of the insulating layer. A possible reason for this is the aggregation of the filler in the resin composition. An effective way to improve dispersibility while inhibiting the aggregation of the filler is to chemically modify a surface of the filler.

Boron nitride is a material having high thermal conductivity, excellent heat dissipation properties, and excellent electrically insulating properties. Accordingly, boron nitride has attracted attention for its use as a filler in the insulating layer of wiring boards (e.g., Japanese Unexamined Patent Application Publication No. 2018-043899). It should be noted, however, that boron nitride particles do not have many functional groups present on their surface, and, therefore, most of the surface is inactive. Accordingly, it is difficult to improve the dispersibility of boron nitride particles in the resin composition by directly treating the surface of the particles by using a method such as silane coupling.

It is to be noted that a dopamine-containing protein secreted from the byssus gland of mussels, which are a type of bivalve, exhibits a stable adhesive strength even in sea water and thus is known as a naturally occurring adhesive. According to Haeshin Lee, Shara M. Dellatore, William M. Miller, Phillip B. Messersmith, Science, 2007, vol. 318, pp. 426-430, when a substrate is immersed in a dopamine solution, the dopamine undergoes self-oxidative polymerization to form a polydopamine thin film on a surface of the substrate. Heng Shen, Jing Guo, Hao Wang, Ning Zhao, Jian Xu, ACS Appl. Mater. Interfaces, 2015, 7, pp. 5701-5708 states that this feature was utilized to improve the dispersibility of boron nitride as a filler, by coating the boron nitride with polydopamine.

It should be noted that, since polydopamine has a large number of hydroxy groups, polydopamine has a feature of readily adsorbing moisture from the air, which is a feature called hydrophilicity. Accordingly, in an instance where boron nitride to which polydopamine is adhered is used as a filler, there are the following concerns. First, a dielectric loss tangent may deteriorate because of the hydroxy groups and adsorbed water. Second, in a solder reflow process, the heating may cause evaporation of moisture adsorbed on a surface of the polydopamine, which may result in the generation of gas bubbles. In addition, if the gas bubbles remain inside a wiring board, various problems may occur.

The present inventors diligently conducted studies to reduce the dielectric loss tangent of a base material. As a result, they arrived at a composite material of the present disclosure.

Overview of Aspects of the Present Disclosure

According to a first aspect of the present disclosure, a composite material includes a base material; and polydopamine adhered to the base material, the polydopamine containing hydroxy groups. At least one hydrogen atom of the hydroxy groups is substituted with an acyl group.

With this configuration, the composite material can have a low dielectric loss tangent.

In a second aspect of the present disclosure, the composite material according to the first aspect may be one in which, for example, the acyl group is a product of acylation of at least some of the hydroxy groups.

In a third aspect of the present disclosure, the composite material according to the first aspect may be one in which, for example, a ratio $N_2/N_1$ satisfies $0.20 \leq N_2/N_1$, where $N_1$ is a number of moles of the hydroxy groups present in the polydopamine, and $N_2$ is a number of moles of the acyl group present in the polydopamine. With this configuration, the composite material can have a lower dielectric loss tangent.

In a fourth aspect of the present disclosure, the composite material according to the third aspect may be one in which, for example, the ratio $N_2/N_1$ satisfies $0.30 \leq N_2/N_1$. With this configuration, the composite material can have an even lower dielectric loss tangent.

In a fifth aspect of the present disclosure, the composite material according to the third or fourth aspect may be one in which, for example, the ratio $N_2/N_1$ satisfies $N_2/N_1 \leq 0.5$.

In a sixth aspect of the present disclosure, the composite material according to any one of the first to fifth aspects may be one in which, for example, the base material includes at least one selected from the group consisting of boron nitride, aluminum nitride, silicon nitride, aluminum oxide, magnesium oxide, and silica. The composite material of the present disclosure is particularly useful when the base material includes at least one selected from the above-mentioned group.

In a seventh aspect of the present disclosure, the composite material according to the sixth aspect may be one in which, for example, the base material includes boron nitride. The composite material of the present disclosure is particularly useful when the base material includes boron nitride.

In an eighth aspect of the present disclosure, the composite material according to any one of the first to seventh aspects may be one in which, for example, the polydopamine includes a functional group represented by —OCOR, the functional group includes the acyl group, and R is a hydrocarbon group.

According to a ninth aspect of the present disclosure, a filler includes the composite material according to any one of the first to eighth aspects. With this configuration, the filler can have a low dielectric loss tangent.

According to a tenth aspect of the present disclosure, a resin composition includes the filler according to the ninth aspect. With regard to the tenth aspect, the resin composition can exhibit a low dielectric loss tangent and have excellent thermal stability.

According to an eleventh aspect of the present disclosure, a prepreg includes the resin composition according to the tenth aspect or a semi-cured product of the resin composition.

According to a twelfth aspect of the present disclosure, a resin-equipped film includes a resin layer including the resin composition according to the tenth aspect or including a semi-cured product of the resin composition; and a support film.

According to a thirteenth aspect of the present disclosure, a resin-equipped metal foil includes a resin layer including the resin composition according to the tenth aspect or including a semi-cured product of the resin composition; and a metal foil.

According to a fourteenth aspect of the present disclosure, a metal-clad laminate includes an insulating layer including a cured product of the resin composition according to the tenth aspect or including a cured product of a prepreg, the prepreg including the resin composition or including a semi-cured product of the resin composition; and a metal foil.

According to a fifteenth aspect of the present disclosure, a wiring board includes an insulating layer including a cured product of the resin composition according to the tenth aspect or including a cured product of a prepreg, the prepreg including the resin composition or including a semi-cured product of the resin composition; and a wiring.

With regard to the eleventh to fifteenth aspects, various applications suitable for use with high frequencies can be provided.

According to a sixteenth aspect of the present disclosure, a method for producing a composite material includes contacting an acylating agent with a material including polydopamine that includes hydroxy groups; and acylating at least some of the hydroxy groups. The material includes a base material and the polydopamine, and the polydopamine is adhered to a surface of the base material. With this configuration, it is possible to produce a composite material having a low dielectric loss tangent.

In a seventeenth aspect of the present disclosure, the method for producing a composite material according to the sixteenth aspect may be one in which, for example, the acylating is carried out in a hydrophilic solvent. With this configuration, the composite material can have a lower dielectric loss tangent.

In an eighteenth aspect of the present disclosure, the method for producing a composite material according to the seventeenth aspect may be one in which, for example, the hydrophilic solvent includes water. With this configuration, the composite material can have an even lower dielectric loss tangent.

In a nineteenth aspect of the present disclosure, the method for producing a composite material according to any one of the sixteenth to eighteenth aspects may be one in which, for example, the acylating agent includes an acid anhydride. With this configuration, the composite material can have a lower dielectric loss tangent.

In a twentieth aspect of the present disclosure, the method for producing a composite material according to the nineteenth aspect may be one in which, for example, the acid anhydride includes at least one selected from the group consisting of methacrylic anhydride, acrylic anhydride, acetic anhydride, and benzoic anhydride. With this configuration, the composite material can have a lower dielectric loss tangent.

Embodiments of the present disclosure will be described below with reference to the drawings.

First Embodiment

A first embodiment will be described below with reference to FIGS. 1 to 3.

Composite Material

FIG. 1 is a diagram illustrating a schematic configuration of a composite material 10, according to the first embodiment. The composite material 10 includes a base material 1 and polydopamine 2. At least some of the hydroxy groups present in the polydopamine 2 are acylated.

The polydopamine 2 may be adhered to a surface of the base material 1. Specifically, the polydopamine 2 may be adhered to the surface of the base material 1 as a result of chemical modification of the surface of the base material 1 with the polydopamine 2. The polydopamine 2 may coat at least a portion of the surface of the base material 1. The polydopamine 2 may coat the entire surface of the base material 1 or only a portion of the surface of the base material 1.

When a compound containing hydroxy groups, such as polydopamine, is reacted with an acylating agent in the presence of a catalyst, the hydroxy groups are acylated. In the composite material 10, at least some of the hydroxy groups present in the polydopamine 2 are acylated. That is, in the composite material 10, the amount of hydroxy groups present in the polydopamine 2 is reduced. Accordingly, a reduction in the dielectric loss tangent is achieved in the composite material 10.

In the composite material 10, whether the acylation of at least some of the hydroxy groups present in the polydopamine 2 has been accomplished can be determined, for example, by an infrared absorption spectrum of the composite material 10. Specifically, in an infrared absorption spectrum, the determination can be made based on an absorption attributable to a stretching vibration of the carbonyl group present in the acylating agent used for the acylation. The infrared absorption spectrum is a spectrum obtained by Fourier transform infrared spectroscopy (FT-IR) in a diffuse reflection mode.

$N_1$ is defined as the number of moles of the hydroxy groups present in the polydopamine 2, and $N_2$ is defined as the number of moles of acyl groups present in the polydopamine 2. In the composite material 10, a ratio $N_2/N_1$ may satisfy $0.20 \leq N_2/N_1$.

The number of moles $N_2$ of the acyl groups present in the polydopamine 2 reflects the number of moles of acylating-agent-derived acyl groups present in the polydopamine 2. Accordingly, the value calculated as $N_2/N_1$ represents the degree to which the acylating agent has reacted with the hydroxy groups present in the polydopamine 2, that is, represents an acylation ratio. In the present embodiment, the ratio $N_2/N_1$ satisfies $0.20 \leq N_2/N_1$, which indicates that the acylating agent has sufficiently reacted with the hydroxy groups present in the polydopamine 2. Accordingly, a reduction in the dielectric loss tangent has been achieved in the composite material 10.

The number of moles $N_1$ is calculated according to equation (1), shown below.

$$N_1 = (W_P/X_D) \times 2 \quad (1)$$

In equation (1), $W_P$ is the mass (g) of the polydopamine 2 adhered to the base material 1. $X_D$ is the molar mass (g/mol) of a dopamine monomer, which is 147.1 (g/mol). In equation (1), the value of 2 is the number of hydroxy groups present in the dopamine monomer.

The number of moles $N_2$ is calculated according to equation (2), shown below.

$$N_2 = W_A/X_A \quad (2)$$

In equation (2), $W_A$ is the mass (g) of the acylating agent present in the polydopamine 2. $X_A$ is the molar mass (g/mol) of the acyl groups, which is specifically the molar mass (g/mol) of the RCO moiety of the acylating agent, which is represented by $(RCO)_2O$.

The $W_P$ and the $W_A$ can be calculated, for example, by thermogravimetric analysis (TGA) under the following conditions. A mass $M_1$ (g) of the base material 1, which is the mass before the polydopamine 2 is adhered, and a mass $M_2$ (g) of the base material 1, which is the mass after the polydopamine 2 is adhered, are measured. The mass $W_P$ of the polydopamine 2 adhered to the base material 1 can be calculated by determining the difference between the measured values. A mass $M_2$ (g) of the base material 1 to which the polydopamine 2 is adhered, which is the mass before the polydopamine 2 is acylated, and a mass $M_3$ (g) of the composite material 10, which is the mass after the polydopamine 2 is acylated, are measured. The mass $W_A$ of the acylating agent present in the polydopamine 2 can be calculated by determining the difference between the measured values.

Conditions

Measurement start temperature: 20° C.

Heating rate: 5° C./min

Attained temperature: 800° C.

Measurement atmosphere: air

Flow rate of gas in measurement atmosphere: 200 mL/min

Note that the polydopamine 2 is soluble in a basic solution. Accordingly, the original base material 1 can be obtained, for example, by immersing the base material 1, to which the polydopamine 2 has been adhered, in a NaOH solution, thereby removing the polydopamine 2 from the base material 1.

In the composite material 10, the ratio $N_2/N_1$ may satisfy $0.30 \leq N_2/N_1$. With this configuration, the composite material 10 has a lower dielectric loss tangent.

In the composite material 10, the ratio $N_2/N_1$ may satisfy $N_2/N_1 \leq 0.5$. With this configuration, the composite material 10 has a lower dielectric loss tangent.

Acylating Agent

The acylation is carried out with an acylating agent. The acylating agent may be any acylating agent that can react with a polar functional group present in the polydopamine 2, such as a hydroxy group, and can acylate the polar functional group. The acylating agent may be an acid anhydride. Examples of acylating agents known in the art include carboxylic acid anhydrides. More specific examples include methacrylic anhydrides, acetic anhydrides, benzoic anhydrides, and propanoic acid anhydrides. The acid anhydride may include at least one selected from the group consisting of methacrylic anhydrides, acrylic anhydrides, acetic anhydrides, and benzoic anhydride. In instances where the acylating agent has a double bond at an end, the double bond reacts with a reactive residue of a resin of an insulating layer to form a bond, and as a result, adhesion between the composite material 10 and the resin is improved. It is desirable, from this standpoint, that the acylating agent be a methacrylic anhydride or an acetic anhydride.

Solvent

The acylation may be carried out by adding an acylating agent to a solvent. The solvent to be used may be a hydrophilic solvent or a hydrophobic solvent. In the present disclosure, the hydrophilic solvent is a solvent having a high affinity for water and may be, for example, a hydroxy-group-containing solvent. The hydrophobic solvent is a solvent having a low affinity for water and may be, for example, a hydroxy-group-free solvent.

The solvent may be a hydrophilic solvent. That is, the acylation may be carried out by adding an acylating agent to a hydrophilic solvent. The polydopamine 2 exhibits hydrophilicity and, therefore, tends to swell in a hydrophilic solvent. Accordingly, using a hydrophilic solvent can promote the entrance of the acylating agent into the interior of the thin film made of the polydopamine 2. Consequently, the acylation ratio of the polydopamine 2 is improved.

Figure 2A:
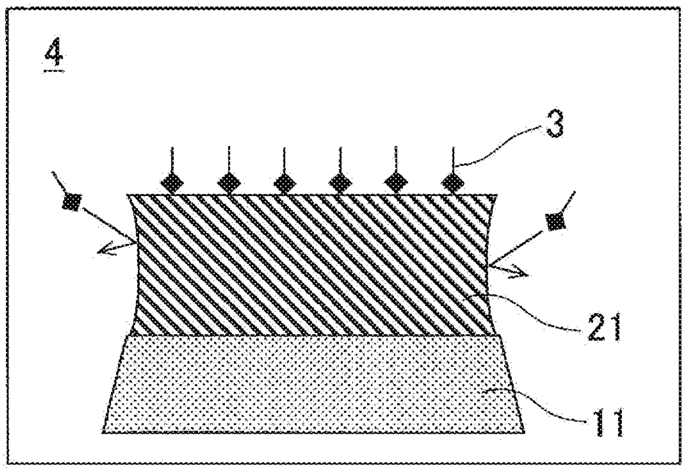
FIG. 2A is a diagram illustrating a movement of an acylating agent that is exhibited when the acylating agent is added to a base material in a hydrophobic solvent, the base material having polydopamine adhered thereto.
Figure 2B:
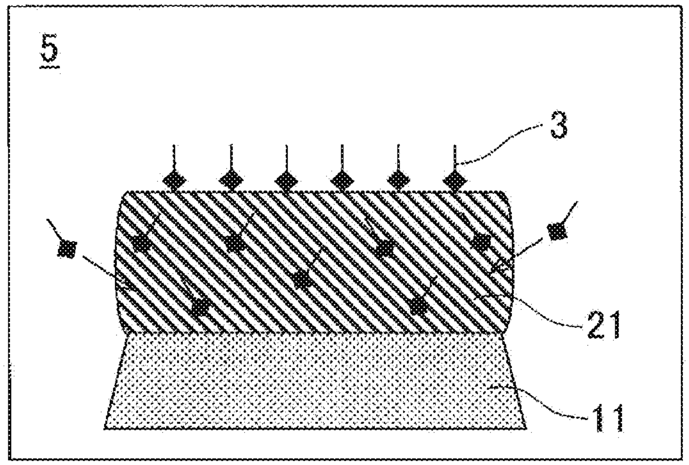
FIG. 2B is a diagram illustrating a movement of an acylating agent that is exhibited when the acylating agent is added to a base material in a hydrophilic solvent, the base material having polydopamine adhered thereto.

FIG. 2A and FIG. 2B are diagrams illustrating movements of an acylating agent 3 that are exhibited when the acylating agent 3 is added to a base material 11, to which polydopamine 21 is adhered. FIG. 2A illustrates an example in which a hydrophobic solvent 4 is used as the solvent. FIG. 2B illustrates an example in which a hydrophilic solvent 5 is used as the solvent. As illustrated in FIG. 2A and FIG. 2B, when the acylating agent 3 is added to the base material 11 to which the polydopamine 21 is adhered, at least some of the hydroxy groups present in the polydopamine 21 are acylated. Consequently, the amount of hydroxy groups present in the polydopamine 21 is reduced, and as a result, a reduction in the dielectric loss tangent is achieved. It should be noted, however, that in the instance where the hydrophobic solvent 4 is used as the solvent, the surface of the thin film made of the polydopamine 21 is acylated, but the entrance of the acylating agent into the interior of the thin film made of the polydopamine 21 tends to be inhibited, as illustrated in FIG. 2A. A reason for this is that since the polydopamine 21 is hydrophilic, the thin film made of the polydopamine 21 tends to shrink in the hydrophobic solvent 4. On the other hand, the thin film made of the polydopamine 21 tends to swell in the hydrophilic solvent 5, as illustrated in FIG. 2B. Accordingly, in the instance where the hydrophilic solvent 5 is used as the solvent, the entrance of the acylating agent 3 into the interior of the thin film made of the polydopamine 21 is promoted. Consequently, not only the hydroxy groups present on the surface of the thin film made of the polydopamine 21 but also the hydroxy groups present in the interior of the thin film made of the polydopamine 21 can be sufficiently reduced.

The hydrophilic solvent is not particularly limited. Examples of the hydrophilic solvent include water, methanol, isopropanol, dimethyl sulfoxide (DMSO), and alcohols, such as ethanol, butanol, and propanol. These hydrophilic organic solvents may be used alone or in a combination of two or more. In particular, the hydrophilic solvent is desirably water. When the hydrophilic solvent is water, sufficient entrance of the acylating agent into the interior of the thin film of the polydopamine 2 can be achieved.

Base Material

The substrate 1 may include at least one selected from the group consisting of boron nitride, aluminum nitride, silicon nitride, aluminum oxide, magnesium oxide, and silica. The composite material 10 is particularly useful when the base material 1 includes at least one selected from the mentioned group.

The base material 1 may include boron nitride. The composite material 10 is particularly useful when the base material 1 includes boron nitride. Boron nitride has excellent thermal conductivity and, therefore, is used, for example, as a filler. The base material 1 may be boron nitride.

Examples of boron nitride that can be used include hexagonal boron nitride (h-BN) having a graphite-type lamellar structure, diamond-type cubic boron nitride (c-BN), and amorphous boron nitride (a-BN). Hexagonal boron nitride is particularly useful because it can be synthesized relatively easily and has the features of excellent thermal conductivity, electrically insulating properties, chemical stability, and thermal stability. The boron nitride that is used may be boron nitride particles. Typically, the boron nitride particles have a white color. The boron nitride particles may have any shape. Examples of the shape of the boron nitride particles include flake shapes, spherical shapes, ellipsoidal shapes, and rod shapes.

The boron nitride particles may have any average particle size. For example, the average particle size of the boron nitride particles may be greater than or equal to 0.05 μm and less than or equal to 100 μm or may be greater than or equal to 0.1 μm and less than or equal to 50 μm. In the present disclosure, the average particle size of the boron nitride particles is a median size. The median size is a particle size (d50) corresponding to a cumulative volume of 50% in a volume-based particle size distribution. The volume-based particle size distribution is measured, for example, by using a laser diffraction analyzer.

Polydopamine

The polydopamine 2 is a polymer of dopamine and may, for example, have one or both of the two types of repeating units represented by formula (1) below. Note that in formula (1) below, the portion having an indoline skeleton may instead have an indole skeleton.

(1)

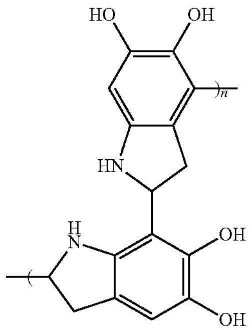

or

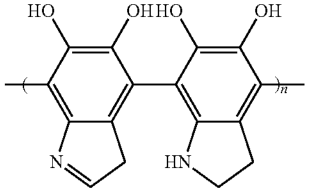

In formula (1), n is an integer greater than or equal to 1. In formula (1), n may be an integer greater than or equal to 2.

The polydopamine 2 may have a shape of a thin film on the surface of the base material 1. The thin film made of the polydopamine 2 may have a thickness of, for example, 1 nm to 300 nm. The thin film made of the polydopamine 2 coats at least a portion of the surface of the base material 1. The thin film made of the polydopamine 2 may coat the entirety of the surface of the base material 1, as illustrated in FIG. 1.

The presence of the polydopamine 2 on the base material 1 can be confirmed by a dark brown color exhibited by the surface of the base material 1.

Regarding the polymer, even if a dopamine-derived functional group is partially changed by bonding of the polymer with another substance, the polymer is regarded as "polydopamine" in the present specification. An example of the change in the functional group is the elimination of a hydroxy group resulting from the substitution of the hydroxy group of the polydopamine with an acyl group of another substance. Note that this substitution is a typical example of the chemical reaction due to the acylation.

Method for Producing Composite Material

Now, a method for producing the above-described composite material 10 will be described.

Figure 3:
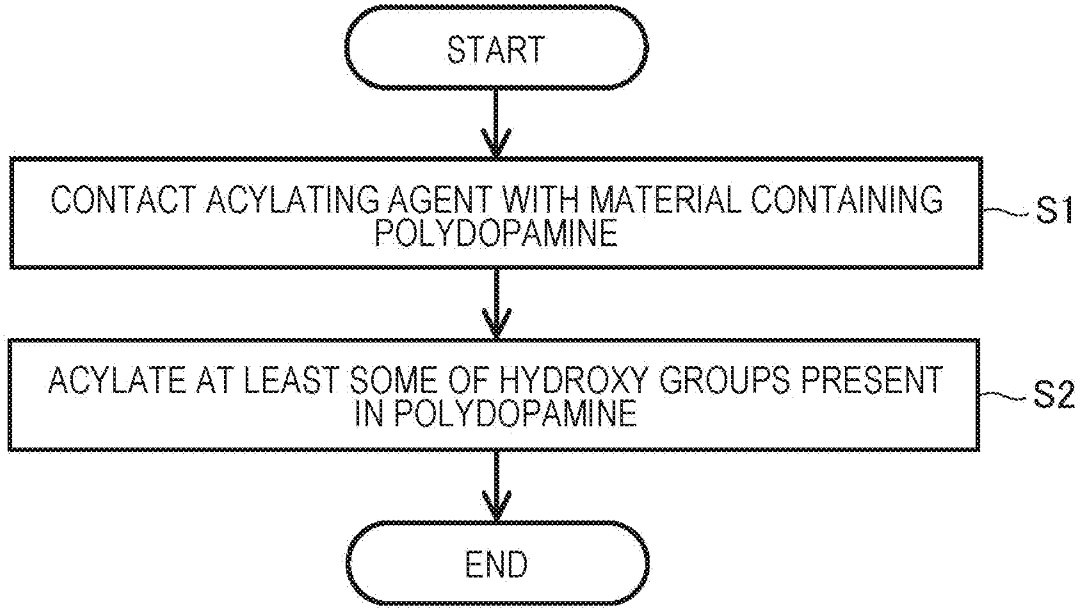
FIG. 3 is a flowchart illustrating an example of a method for producing the composite material according to the first embodiment.

FIG. 3 is a flowchart illustrating an example of the method for producing the composite material 10. The method for producing the composite material 10 includes contacting an acylating agent with a material including the polydopamine 2 (step S1); and acylating at least some of hydroxy groups present in the polydopamine 2 (step S2). The material containing the polydopamine 2 includes the base material 1 and the polydopamine 2 adhered to the surface of the base material 1.

The material containing the polydopamine 2 can be obtained by causing the polydopamine 2 to be adhered to the surface of the base material 1 by utilizing self-oxidative polymerization of dopamine. Specifically, the base material 1 is contacted with a dopamine solution to cause oxidative polymerization of the dopamine, thereby causing the polydopamine 2 to be adhered to the surface of the base material 1. In this manner, a thin film made of the polydopamine 2 can be formed.

The dopamine solution can be obtained by adding dopamine hydrochloride to a Tris-HCl solution that has a pH adjusted to 8.5 and then stirring the solution. The dopamine solution may have any concentration, which may be, for example, within a range of 0.01 mg/mL to 30 mg/mL. The dopamine solution has a pH within a range of 6 to 11 or may have a pH within a range of 8 to 10. The pH of the dopamine solution can be adjusted by mixing a Tris-HCl solution or the like. During the oxidative polymerization, the dopamine solution has a temperature of, for example, 10° C. to 100° C. A polymerization time is, for example, 1 hour to 48 hours. The thin film made of the polydopamine 2 has a thickness of, for example, 1 nm to 300 nm. The thickness of the thin film made of the polydopamine 2 can be controlled by the polymerization time.

In step S1, the acylating agent is contacted with the material containing the polydopamine 2. Examples of the acylating agent are as described above.

In step S2, regarding the material containing the polydopamine 2, at least some of the hydroxy groups present in the polydopamine 2 are acylated. Accordingly, the composite material 10 can be obtained.

The acylation may be carried out by adding an acylating agent to a hydrophilic solvent. Examples of the hydrophilic solvent are as described above. In particular, the hydrophilic solvent is desirably water.

The thin film made of the polydopamine 21 tends to swell in the hydrophilic solvent 5, as illustrated in FIG. 2B. Accordingly, in the instance where the hydrophilic solvent 5 is used as the solvent, the entrance of the acylating agent 3 into the interior of the thin film made of the polydopamine 21 is promoted. Consequently, not only the hydroxy groups present on the surface of the thin film made of the polydopamine 21 but also the hydroxy groups present in the interior of the thin film made of the polydopamine 21 can be sufficiently reduced.

The acylation reaction may be carried out in the presence of a catalyst. Examples of the catalyst include N,N-dimethylaminopyridine (DMAP) and aluminum chloride. The acylation reaction proceeds, for example, in a manner shown in the following scheme. The following scheme is an example in which a carboxylic acid anhydride is used as the acylating agent. The hydroxy groups in the polydopamine 2 are reacted with the acylating agent in the presence of a catalyst (DMAP). Accordingly, the hydroxy groups in the polydopamine 2 are acylated.

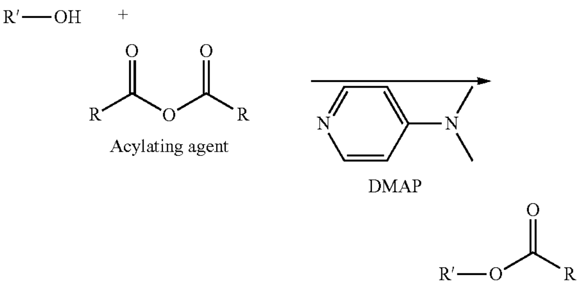

For the acylation, a reaction temperature and a reaction time are appropriately selected depending on the amounts of use of the catalyst and the acylating agent. The reaction temperature is typically greater than or equal to 0° C. and less than or equal to 100° C. and may be greater than or equal to 5° C. and less than or equal to 50° C. or greater than or equal to 10° C. and less than or equal to 30° C. The reaction time is typically greater than or equal to 1 hour and less than or equal to 48 hours and may be greater than or equal to 5 hours and less than or equal to 40 hours or greater than or equal to 10 hours and less than or equal to 30 hours. When the reaction time is greater than or equal to 5 hours, the acylation sufficiently proceeds, and, consequently, it is possible to sufficiently reduce the amount of hydroxy groups present in the polydopamine. When the reaction time is less than or equal to 40 hours, it is possible to inhibit a reduction in productivity and an increase in costs.

Regarding wiring boards, when the frequency is in a high-frequency band ranging from GHz to THz frequencies, the dielectric loss tangent greatly depends on the orientation polarization of organic molecules that are present in a material of the wiring boards. The hydroxy group of the polydopamine 2 can increase the dielectric loss tangent. In the composite material 10, however, the number of hydroxy groups in the polydopamine 2 is reduced as a result of the acylation, and, consequently, the composite material 10 can have a low dielectric loss tangent.

Second Embodiment

According to a second embodiment, a thermally conductive gap filler includes the composite material 10 of the first embodiment.

In the present disclosure, a "thermally conductive gap filler" is a filler that is used to dissipate heat from electronic components by being applied to electronic components, such as a substrate material, to fill an air pocket, a space, or the like. The thermally conductive gap filler is a curable thermally conductive paste that is in a paste form and cures to have a sheet form. The thermally conductive gap filler of the present embodiment can have improved thermal stability. In addition, the filler can be inhibited from having moisture adsorbed thereon.

The thermally conductive gap filler of the present embodiment can be produced, for example, by kneading the composite material 10 of the first embodiment with an epoxy resin, a silicone-containing resin, a silicone-free acrylic resin, or a ceramic resin.

Third Embodiment

According to a third embodiment, a filler for a thermally conductive grease includes the composite material 10 of the first embodiment.

In the present disclosure, a "filler for a thermally conductive grease" is a filler for use in a thermally conductive grease. The thermally conductive grease is a non-curing, thermally conductive paste that is used to dissipate heat from electronic components by being applied to electronic components, such as a substrate material, to fill an air pocket, a space, or the like. The filler for a thermally conductive grease of the present embodiment can improve the thermal stability of fillers. In addition, the filler can be inhibited from having moisture adsorbed thereon.

The filler for a thermally conductive grease of the present embodiment can be produced, for example, by kneading the composite material 10 of the first embodiment with an epoxy resin, a silicone-containing resin, a silicone-free acrylic resin, or a ceramic resin.

Fourth Embodiment

Figure 4:
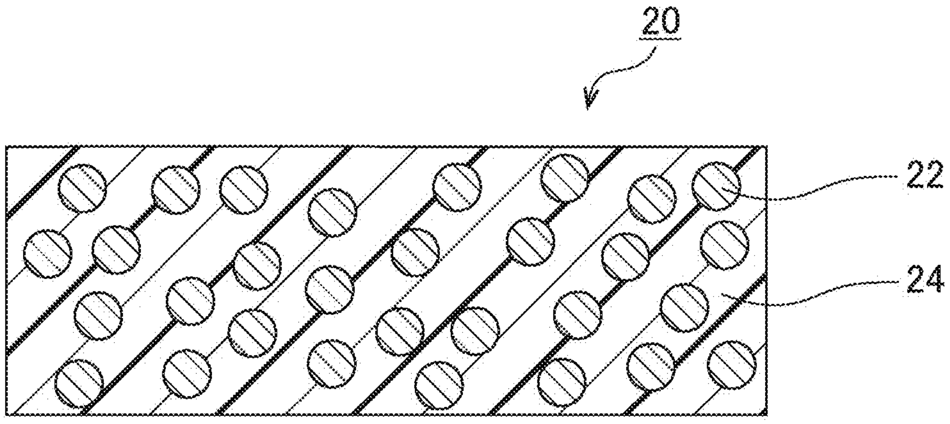
FIG. 4 is a diagram illustrating a schematic configuration of a resin composition according to a fourth embodiment.

FIG. 4 is a diagram illustrating a schematic configuration of a resin composition 20, according to a fourth embodiment. The resin composition 20 includes, for example, a filler 22 and a curable resin 24.

The filler 22 includes the composite material 10, which is described above in the first embodiment. According to the present embodiment, the resin composition 20 exhibits a low dielectric loss tangent and has excellent thermal stability. The filler 22 may be composed entirely of the composite material 10 or may include one or more different filler materials, such as silica particles, in addition to the composite material 10.

Examples of the curable resin 24 include epoxy resins, cyanate ester compounds, maleimide compounds, phenolic resins, acrylic resins, polyamide resins, polyamide-imide resins, thermosetting polyimide resins, and polyphenylene ether resins. The curable resin 24 may be one of these or a combination of two or more of these.

The resin composition 20 may include one or more additional components. Examples of the additional components include curing agents, flame retardants, UV absorbers, antioxidants, reaction initiator, silane coupling agents, fluorescent brightening agents, photosensitizers, dyes, pigments, thickeners, lubricants, defoaming agents, dispersants, leveling agents, brighteners, antistatic agents, polymerization inhibitors, and organic solvents. One of these or a combination of two or more of these may be used if necessary.

Fifth Embodiment

According to a fifth embodiment, a prepreg includes the resin composition 20 of the fourth embodiment, illustrated in FIG. 4, or a semi-cured product thereof and also includes a fibrous base material. The fibrous base material is present in a matrix of the resin composition 20 or of the semi-cured product. The prepreg is a composite material composed of the resin composition 20 and the fibrous base material. According to the present embodiment, the prepreg is suitable for high-frequency-compatible wiring boards.

In the present embodiment, the semi-cured product is a material in which the resin composition 20 has been incompletely cured so that further curing can take place. That is, the semi-cured product is a material in a state in which the resin composition 20 has been partially cured. When the resin composition 20 is heated, for example, a viscosity thereof gradually decreases. When the heating is continued, curing commences subsequently, and the viscosity gradually increases. In such instances, the partially cured state may be a state of the resin composition 20 during a period lasting from when the viscosity begins to increase until the resin composition 20 completely cures.

The fibrous base material may be a material known in the art that is used in various laminates for an electrically insulating material. Examples of the fibrous base material include glass cloths, aramid cloths, polyester cloths, nonwoven glass fabrics, nonwoven aramid fabrics, nonwoven polyester fabrics, pulp paper, and linter paper.

The resin composition 20 is impregnated into the fibrous base material by a treatment such as immersion or application. Heating the fibrous base material, which has been impregnated with the resin composition 20, under predetermined heating conditions gives the prepreg of the present embodiment that is in a pre-curing state or a semi-cured state.

Sixth Embodiment

Figure 5:
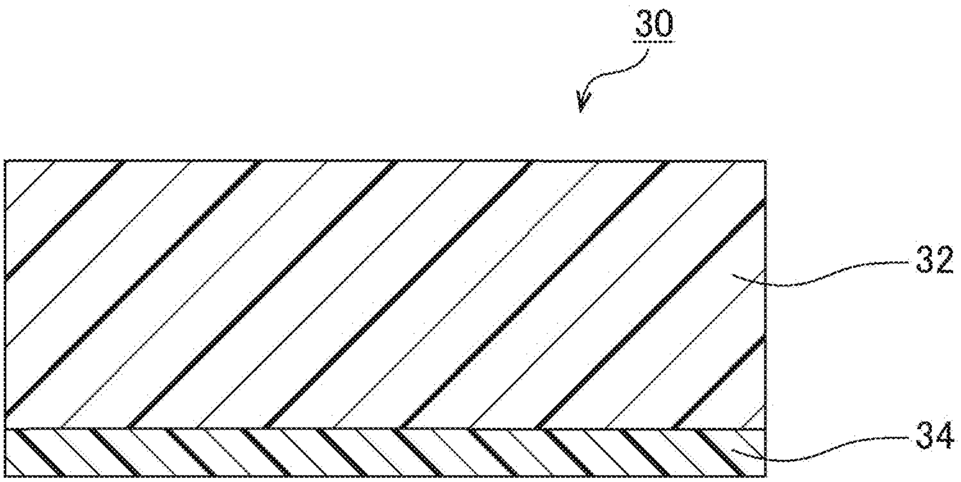
FIG. 5 is a cross-sectional view of a resin-equipped film according to a sixth embodiment.

FIG. 5 is a cross-sectional view of a resin-equipped film 30, according to a sixth embodiment. The resin-equipped film 30 includes a resin layer 32 and a support film 34. The resin layer 32 includes the resin composition 20 or a semi-cured product thereof. According to the present embodiment, the resin-equipped film 30 is suitable for insulating layers. The resin layer 32 is supported by the support film 34. In the example of FIG. 5, the support film 34 is located on a surface of the resin layer 32. Note that an additional layer, such as an adhesive layer, may be provided between the resin layer 32 and the support film 34.

The resin layer 32 includes the resin composition 20 of the fourth embodiment, illustrated in FIG. 4, or a semi-cured product thereof and may or may not include a fibrous base material. Fibrous base materials that can be used are the same as the materials for the fibrous base material of the prepreg. When the resin layer 32 is cured, the resin layer 32 transforms into an insulating layer. An example of such an insulating layer is the insulating layer of a wiring board.

The support film 34 may be any support film that is typically used in a resin-equipped film. Examples of the support film 34 include resin films such as polyester films and polyethylene terephthalate films.

Seventh Embodiment

Figure 6:
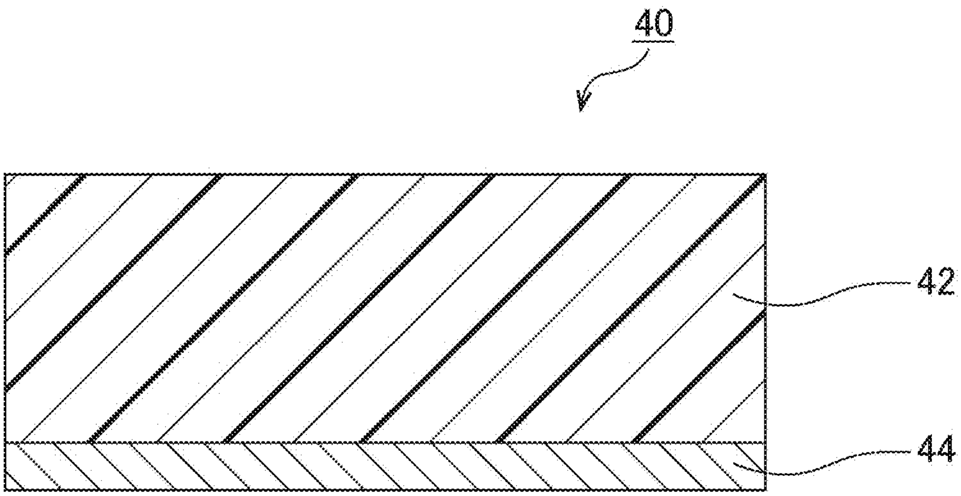
FIG. 6 is a cross-sectional view of a resin-equipped metal foil according to a seventh embodiment.

FIG. 6 is a cross-sectional view of a resin-equipped metal foil 40, according to a seventh embodiment. The resin-equipped metal foil 40 includes a resin layer 42 and a metal foil 44. The resin layer 42 includes the resin composition 20 or a semi-cured product thereof. The resin layer 42 is supported by the metal foil 44. According to the present embodiment, the resin-equipped metal foil 40 is suitable for electronic circuit components, such as wiring boards. In the examples of FIG. 6, the metal foil 44 is located on a surface of the resin layer 42. Note that an additional layer, such as an adhesive layer, may be provided between the resin layer 42 and the metal foil 44.

The resin layer 42 includes the resin composition 20 of the fourth embodiment, illustrated in FIG. 4, or a semi-cured product thereof and may or may not include a fibrous base material. Fibrous base materials that can be used are the same as the materials for the fibrous base material of the prepreg. When the resin layer 42 is cured, the resin layer 42 transforms into an insulating layer. An example of such an insulating layer is the insulating layer of a wiring board.

The metal foil 44 may be any metal foil that is typically used in a resin-equipped metal foil or a metal-clad laminate. Examples of the metal foil include copper foils and aluminum foils.

Eighth Embodiment

Figure 7:
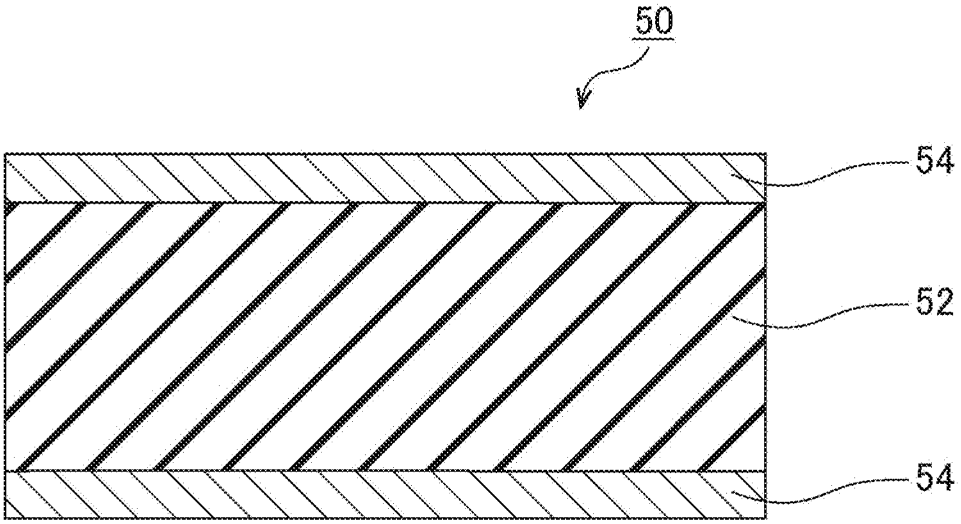
FIG. 7 is a cross-sectional view of a metal-clad laminate according to an eighth embodiment.

FIG. 7 is a cross-sectional view of a metal-clad laminate 50, according to an eighth embodiment. The metal-clad laminate 50 includes an insulating layer 52 and at least one metal foil 54. According to the present embodiment, the metal-clad laminate 50 is suitable for wiring boards. The insulating layer 52 includes a cured product of the resin composition 20 of the fourth embodiment, illustrated in FIG. 4, or a cured product of the prepreg of the fifth embodiment. The metal foil 54 is located on a surface of the insulating layer 52. In the present embodiment, the metal foil 54 is located on each of the front and back surfaces of the insulating layer 52.

The metal-clad laminate 50 is typically produced with the prepreg of the fifth embodiment. For example, a multi-layer body is formed by stacking 2 to 20 sheets of the prepreg on top of one another. The metal foil is placed on one side or both sides of the multi-layer body of the prepregs, and then, the multi-layer body is heated and pressed. In this manner, the metal-clad laminate 50 can be obtained. Examples of the metal foil 54 include copper foils and aluminum foils.

The production of the metal-clad laminate 50 can be carried out under forming conditions that are typically used in the production of, for example, a laminate or multi-laminate for an electrically insulating material.

Ninth Embodiment

Figure 8:
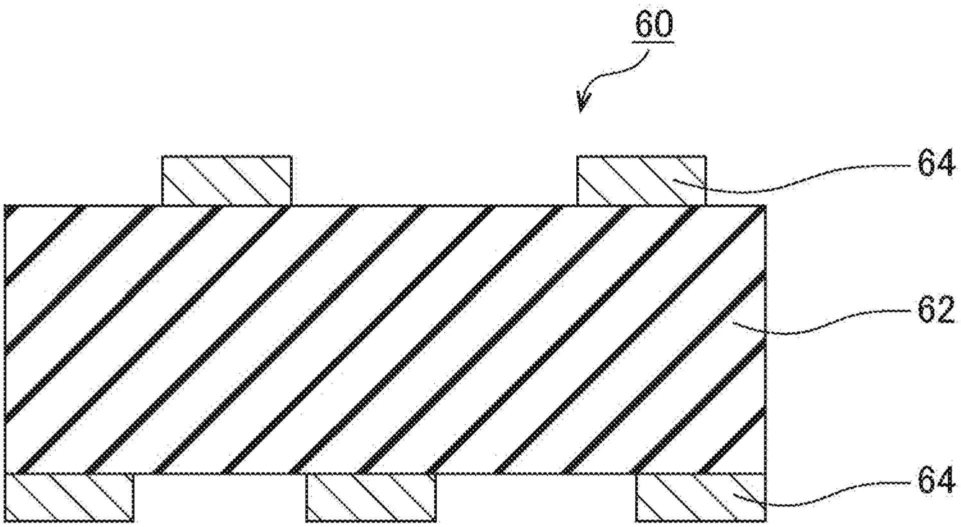
FIG. 8 is a cross-sectional view of a wiring board according to a ninth embodiment.

FIG. 8 is a cross-sectional view of a wiring board 60, according to a ninth embodiment. The wiring board 60 includes an insulating layer 62 and a wiring 64. According to the present embodiment, the wiring board 60 is suitable for use with high frequencies. The insulating layer 62 includes a cured product of the resin composition 20 of the fourth embodiment, illustrated in FIG. 4, or a cured product of the prepreg of the fifth embodiment. The wiring 64 is supported by the insulating layer 62. Specifically, the wiring 64 is located on the insulating layer 62. The wiring 64 can be formed by partially removing the metal foil.

The wiring board 60 provided with the wiring 64, which forms a circuit, on the surface of the insulating layer 62 can be obtained by patterning the metal foil 54 on the surface of the metal-clad laminate 50, illustrated in FIG. 7, by using a method such as etching. That is, the wiring board 60 can be obtained by partially removing the metal foil 54 from the surface of the metal-clad laminate 50 such that a circuit is formed.

An additional layer of the prepreg of the fifth embodiment may be applied onto at least one side of the wiring board 60, and the resultant may be heated and pressed to form another laminate. The metal foil on the surface of the resulting laminate may be patterned to form a wiring. In this case, a multi-laminate wiring board can be obtained.

EXAMPLES

The present disclosure will be described in detail below with reference to Examples. The Examples are intended to describe the present disclosure and not intended to limit the present disclosure.

Example 1

The base material used was boron nitride. The boron nitride was h-BN (manufactured by Denka Company Limited, product designation: SGP, average particle size: 18 μm). A dopamine solution (concentration: 23 mg/mL) was obtained by adding dopamine hydrochloride to a Tris-HCl solution that had a pH adjusted to 8.5 and then stirring the solution. 4.5 g of the boron nitride was added to the resulting dopamine solution. The solution was stirred with a magnetic stirrer for 24 hours, with the solution temperature being set at 80° C. Subsequently, the resultant was filtered to afford a solid. The resulting solid was washed with water and subsequently dried. In this manner, particles of boron nitride to which polydopamine was adhered (for convenience, hereinafter referred to as a "polydopamine-modified boron nitride") were obtained. The presence of the polydopamine was confirmed by a dark brown color exhibited by a surface of the particles of boron nitride.

Next, 2.0 g of the polydopamine-modified boron nitride was added to 20 ml of deionized water, and furthermore, 0.1 g of DMAP, which was used as a catalyst, was added and dissolved. Next, 2 ml of methacrylic anhydride, which was used as an acylating agent, was added to form a mixed solution. The mixed solution was stirred with a magnetic stirrer for 24 hours, with the temperature of the mixed solution being set at 25° C. Subsequently, the mixed solution was filtered to afford a solid. The resulting solid was washed with toluene and subsequently dried. Accordingly, particles of a composite material of Example 1 were obtained.

Example 2

Particles of a composite material of Example 2 were obtained in a manner similar to that of Example 1, except that 2 ml of acetic anhydride was used as the acylating agent, instead of 2 ml of methacrylic anhydride.

Example 3

Particles of a composite material of Example 3 were obtained in a manner similar to that of Example 1, except that 2 ml of acrylic anhydride was used as the acylating agent, instead of 2 ml of methacrylic anhydride.

Example 4

Particles of a composite material of Example 4 were obtained in a manner similar to that of Example 1, except that 20 ml of chloroform was used as the solvent, instead of 20 ml of deionized water.

Comparative Example 1

Particles of Comparative Example 1 that were used were those of polydopamine-modified boron nitride that were obtained in a manner similar to that of Example 1. That is, in Comparative Example 1, the polydopamine-modified boron nitride was used without being treated with an acylating agent.

The particles obtained in the Examples and the Comparative Example described above were each evaluated for the dielectric loss tangent and the acylation ratio.

Measurement of Dielectric Loss Tangent

The particles obtained in each of Examples 1 to 4 and Comparative Example 1 were subjected to a measurement of the dielectric loss tangent at a frequency of 1 GHz. The measuring device used was a cavity resonator (MS46122B, manufactured by AET, Inc.).

The measurement was performed to determine whether the dielectric loss tangent was good. When the measured value was less than or equal to 0.0045, it was determined that the dielectric loss tangent was good. When the measured value was less than or equal to 0.0030, it was determined that the dielectric loss tangent was particularly good.

Evaluation of Acylation Ratio

Regarding the particles obtained in each of Examples 1 to 4 and Comparative Example 1, the ratio $N_2/N_1$ was determined in the manner described above.

Table 1 shows the dielectric loss tangents and the ratios $N_2/N_1$ of Examples 1 to 4 and Comparative Example 1, together with the acylating agents and the solvents that were used.

TABLE 1

| | Acylating Agent | Solvent | Dielectric Loss Tangent | $N_2/N_1$ |
|---|---|---|---|---|
| Example 1 | Methacrylic Anhydride | Water | 0.0024 | 0.386 |
| Example 2 | Acetic Anhydride | Water | 0.0027 | 0.425 |
| Example 3 | Acrylic Anhydride | Water | 0.0038 | 0.349 |
| Example 4 | Methacrylic Anhydride | Chloroform | 0.0042 | 0.216 |
| Comparative Example 1 | None | None | 0.0072 | — |

Discussion

As can be seen from Table 1, the composite materials of Examples 1 to 4, in which at least some of the hydroxy groups present in the polydopamine were acylated with an acylating agent, had dielectric loss tangents of 0.0045 or less, which were good values. The composite materials of Examples 1 to 4 had $N_2/N_1$ ratios that satisfied $0.20 \leq N_2/N_1$. Examples 1 to 3, in which water was used as the solvent, had dielectric loss tangents of 0.0040 or less, which were even better values. The composite materials of Examples 1 to 3 had $N_2/N_1$ ratios that satisfied $0.35 \leq N_2/N_1$.

In the Examples, the base material used was boron nitride. Note that the boron nitride may be replaced with a different material, such as aluminum nitride, silicon nitride, aluminum oxide, magnesium oxide, or silica. It is presumed that in these cases, a reduction in the dielectric loss tangent is also achieved. A reason for this presumption is that the composite material of the present disclosure is one in which a reduction in the dielectric loss tangent has been achieved by reducing the amount of hydroxy groups that are present in polydopamine.

While the present disclosure has been appropriately and sufficiently described through the embodiments presented above, for the purpose of representation of the present disclosure, those skilled in the art should be aware that the above-described embodiments can be easily changed and/or modified. Accordingly, changed embodiments or modified embodiments that are implemented by those skilled in the art are deemed to be encompassed by the scope of the claims described in "WHAT IS CLAIMED IS", as long as the changed embodiments or modified embodiments are not at a level that departs from the scope of the claims.

The composite material of the present disclosure enables the realization of a filler having a reduced dielectric loss tangent and, therefore, is suitable, for example, for applications such as wiring boards of electronic devices that are used in high-capacity communications.

What is claimed is:

1. A composite material comprising:

a base material; and polydopamine adhered to the base material, the polydopamine comprising hydroxy groups, wherein at least one hydrogen atom of the hydroxy groups is substituted with an acyl group and at least one other hydrogen atom of the hydroxy groups remains unsubstituted.

2. The composite material according to claim 1, wherein a ratio $N_2/N_1$ satisfies $0.20 \leq N_2/N_1$, where $N_1$ is a number of moles of the hydroxy groups present in the polydopamine, and $N_2$ is a number of moles of the acyl group present in the polydopamine.

3. The composite material according to claim 2, wherein the ratio $N_2/N_1$ satisfies $0.30 \leq N_2/N_1$.

4. The composite material according to claim 2, wherein the ratio $N_2/N_1$ satisfies $N_2/N_1 \leq 0.5$.

5. The composite material according to claim 1, wherein the base material comprises at least one selected from the group consisting of boron nitride, aluminum nitride, silicon nitride, aluminum oxide, magnesium oxide, and silica.

6. The composite material according to claim 5, wherein the base material comprises boron nitride.

7. The composite material according to claim 1, wherein
the polydopamine comprises a functional group represented by —OCOR,
the functional group comprises the acyl group, and
R is a hydrocarbon group.

8. A filler comprising the composite material according to claim 1.

9. A resin composition comprising the filler according to claim 8.

10. A prepreg comprising the resin composition according to claim 9 or comprising a semi-cured product of the resin composition.

11. A resin-equipped film comprising:
a resin layer comprising the resin composition according to claim 9 or comprising a semi-cured product of the resin composition; and
a support film.

12. A resin-equipped metal foil comprising:
a resin layer comprising the resin composition according to claim 9 or comprising a semi-cured product of the resin composition; and
a metal foil.

13. A metal-clad laminate comprising:
an insulating layer comprising a cured product of the resin composition according to claim 9 or comprising a cured product of a prepreg, the prepreg comprising the resin composition or comprising a semi-cured product of the resin composition; and
a metal foil.

14. A wiring board comprising:
an insulating layer comprising a cured product of the resin composition according to claim 9 or comprising a cured product of a prepreg, the prepreg comprising the resin composition or comprising a semi-cured product of the resin composition; and
a wiring.

15. A method for producing a composite material, the method comprising:
contacting an acylating agent with a material comprising polydopamine that comprises hydroxy groups; and
acylating at least some of the hydroxy groups such that at least one other hydroxy group remains unsubstituted, wherein
the material comprises a base material and the polydopamine, and
the polydopamine is adhered to a surface of the base material.

16. The method for producing a composite material according to claim 15, wherein the acylating is carried out in a hydrophilic solvent.

17. The method for producing a composite material according to claim 16, wherein the hydrophilic solvent comprises water.

18. The method for producing a composite material according to claim 15, wherein the acylating agent comprises an acid anhydride.

19. The method for producing a composite material according to claim 18, wherein the acid anhydride comprises at least one selected from the group consisting of methacrylic anhydride, acrylic anhydride, acetic anhydride, and benzoic anhydride.

* * * * *